(12) United States Patent
Wu et al.

(10) Patent No.: US 8,765,025 B2
(45) Date of Patent: Jul. 1, 2014

(54) SILVER NANOPARTICLE COMPOSITION COMPRISING SOLVENTS WITH SPECIFIC HANSEN SOLUBILITY PARAMETERS

(75) Inventors: Yiliang Wu, Ontario (CA); Yulin Wang, Ontario (CA); Mahya Mohktari, Ontario (CA); Roger E. Gaynor, Ontario (CA); Nan-Xing Hu, Ontario (CA); Marko D. Saban, Toronto (CA)

(73) Assignee: Xerox Corporation, Norwalk, CT (US)

( * ) Notice: Subject to any disclaimer, the term of this patent is extended or adjusted under 35 U.S.C. 154(b) by 34 days.

(21) Appl. No.: 12/797,251

(22) Filed: Jun. 9, 2010

(65) Prior Publication Data

US 2011/0305821 A1 Dec. 15, 2011

(51) Int. Cl.
*H01B 1/02* (2006.01)
(52) U.S. Cl.
USPC .......... 252/514; 75/351; 106/31.19; 174/257; 427/123; 427/125; 427/256; 428/336; 438/179; 438/311
(58) Field of Classification Search
USPC .............. 252/500, 514; 73/351; 438/179, 311; 106/31.19; 174/257; 427/372.4, 256, 427/123, 125; 428/336; 75/351
See application file for complete search history.

(56) References Cited

U.S. PATENT DOCUMENTS

| | | | |
|---|---|---|---|
| 6,107,117 A | 8/2000 | Bao et al. | |
| 7,270,694 B2 * | 9/2007 | Li et al. | 75/351 |
| 8,003,019 B2 * | 8/2011 | Sato et al. | 252/514 |
| 2003/0136958 A1 | 7/2003 | Ong et al. | |
| 2003/0160230 A1 | 8/2003 | Ong et al. | |
| 2003/0160234 A1 | 8/2003 | Ong et al. | |
| 2006/0292769 A1 * | 12/2006 | Wada et al. | 438/179 |
| 2007/0099357 A1 | 5/2007 | Li et al. | |
| 2008/0032047 A1 * | 2/2008 | Parashar et al. | 427/372.2 |
| 2009/0025967 A1 * | 1/2009 | Boureghda et al. | 174/257 |
| 2009/0148600 A1 * | 6/2009 | Li et al. | 427/256 |
| 2009/0181183 A1 | 7/2009 | Li et al. | |
| 2010/0113686 A1 | 5/2010 | Ting et al. | |
| 2010/0283013 A1 * | 11/2010 | Sato et al. | 252/514 |
| 2011/0039096 A1 * | 2/2011 | Wu et al. | 428/336 |
| 2011/0059233 A1 * | 3/2011 | Liu et al. | 427/123 |
| 2013/0075672 A1 * | 3/2013 | Rucareanu | 252/514 |

FOREIGN PATENT DOCUMENTS

| | | | | |
|---|---|---|---|---|
| CA | 2648539 | | 7/2009 | |
| CA | 2674522 | | 2/2010 | |
| JP | 2009-215502 | * | 9/2009 | ............ C09D 11/00 |
| JP | 2010-097808 | * | 4/2010 | ............. H01B 1/22 |

(Continued)

OTHER PUBLICATIONS

U.S. Appl. No. 12/369,861, filed Feb. 12, 2009.

(Continued)

*Primary Examiner* — Khanh Tuan Nguyen
(74) *Attorney, Agent, or Firm* — Oliff PLC (57) ABSTRACT

A metal nanoparticle composition includes an organic-stabilized metal nanoparticle and a solvent in which the solvent selected has the following Hansen solubility parameters: a dispersion parameter of about 16 $MPa^{0.5}$ or more, and a sum of a polarity parameter and a hydrogen bonding parameter of about 8.0 $MPa^{0.5}$ or less. The metal nanoparticle composition is suitable for printing conductive lines that are uniform, smooth and narrow on various substrate surfaces. The metal nanoparticle composition is able to form printed conductive features having a coffee ring effect ratio of about 1.2 to about 0.8, a surface roughness of about 15 or less and a line width of about 200 microns or less.

16 Claims, 3 Drawing Sheets

(56) References Cited

FOREIGN PATENT DOCUMENTS

| KR | 1020090018538 | | 2/2009 |
|---|---|---|---|
| KR | 100908107 B1 | | 7/2009 |
| WO | WO 2007/055542 | | 5/2007 |
| WO | WO 2009/087918 | * | 7/2009 |

OTHER PUBLICATIONS

U.S. Appl. No. 12/331,573, filed Dec. 10, 2008.
U.S. Appl. No. 12/753,655, filed Apr. 1, 2010.
German Search Report dated Nov. 21, 2011 issued in German Patent Application No. 10 2011 076 749.5, with English translation.
H. Zhang et al., "Dissipative particle dynamics simulation of the formation and stabilization of iron nanoparticle", Abstracts of Papers, 237$^{th}$ ACS National Meeting, Salt Lake City, UT, United States, Mar. 22-26, 2009, COMP-103.
Office Action issued in Canadian Patent Application No. 2,742,009 mailed May 31, 2012.

* cited by examiner

SILVER NANOPARTICLE COMPOSITION COMPRISING SOLVENTS WITH SPECIFIC HANSEN SOLUBILITY PARAMETERS

BACKGROUND

Disclosed herein, in various embodiments, are stable, high performing nanoparticle compositions suitable for printing, such as by inkjet printing.

Fabrication of electronic circuit elements using liquid deposition techniques is of profound interest as such techniques provide potentially low-cost alternatives to conventional mainstream amorphous silicon technologies for electronic applications such as thin film transistors (TFTs), light-emitting diodes (LEDs), RFID tags, photovoltaics, printed memory, and the like. However, the deposition and/or patterning of functional electrodes, pixel pads, and conductive traces, lines and tracks, which meet the conductivity, processing, morphology, and cost requirements for practical applications, have been a great challenge.

Solution-processable conductors are of great interest for use in such electronic applications. Metal nanoparticle-based inks represent a promising class of materials for printed electronics. However, most metal nanoparticles, such as silver and gold metal nanoparticles, require large molecular weight stabilizers to ensure proper solubility and stability in forming a printing solution. These large molecular weight stabilizers inevitably raise the annealing temperature for the metal nanoparticles above 200° C. in order to burn off the stabilizers, which temperatures are incompatible with most low-cost plastic substrates such as polyethylene terephthalate (PET) and polyethylene naphthalate (PEN) that the solution may be coated onto and can cause damage thereto.

Furthermore, current metal nanoparticle compositions when deposited on a substrate often result in conductive metal ink lines that are too wide, exhibit a low conductivity, and have a "coffee ring effect." The current metal ink compositions also have a large surface roughness, which is exhibited by "black dots" appearing within the printed line. Coffee ring effect is referred to herein as when the particles in a given droplet end up along the circumference of the circle having a very thin center where the droplet was deposited on the substrate (i.e. a non-uniform deposition). In a cross-section of the droplet, a bimodal line profile (two peaks) in a surface profile measurement is observed. The deposition of a conductive metal line that exhibits a coffee ring effect and/or that are otherwise too wide may limit the inks use in certain applications.

Jettable compositions would be desirable to enable drop-on-demand deposition and printing with functional features such as electrodes and interconnects for electronic devices.

SUMMARY

There is a need for conductive metal nanoparticle compositions with improved conductivity and that do not exhibit a coffee ring effect upon deposition, for example, wherein the metal nanoparticle composition can be deposited with a sufficient width and thickness that is suitable for further processing. Furthermore, there is a need for conductive metal nanoparticle compositions that produce a narrow line for high-resolution devices. There is also a need for metal nanoparticle compositions that have a minimal surface roughness for multilayer integration and thus do not produce any black dots when printed compared to other metal nanoparticle compositions.

The above and other needs are addressed by the present application, wherein in embodiments, described is a composition comprising a metal nanoparticle stabilized by an organoamine stabilizer, and a solvent.

The solvent is selected based on the Hansen solubility parameters. The Hansen solubility parameters are dispersion, polarity and hydrogen bonding. The selected solvent should have Hansen solubility parameters in which the sum of the polarity parameter and the hydrogen bonding parameter is about 8.0 $MPa^{0.5}$ or less, and the dispersion parameter is about 16 $MPa^{0.5}$ or more.

In embodiments, described is a method of forming conductive features on a substrate, the method comprising: providing a liquid composition containing a metal nanoparticle stabilized by an organoamine stabilizer, and the solvent, depositing the liquid composition onto the substrate to form deposited features, and heating the deposited features on the substrate to a temperature from about 70° C. to about 200° C. to form conductive features on the substrate.

BRIEF DESCRIPTION OF THE DRAWINGS

The following is a brief description of the drawings.

EMBODIMENTS

Described herein is a composition containing metal nanoparticles that may be, but is not limited to being, used for printing. When the composition is used for printing, improved printing line performance is exhibited. The composition is comprised of a metal nanoparticle, a stabilizer for the nanoparticle and a solvent. The composition may be printed onto a substrate, then annealed to form conductive features on a substrate. Also described herein is a composition with enhanced properties such as reduced agglomeration and improved stability of viscosity of the composition.

The term "nano" as used in "metal nanoparticles" refers to, for example, a particle size of less than about 1,000 nm, such as, for example, from about 0.5 nm to about 1,000 nm, for example, from about 1 nm to about 500 nm, from about 1 nm to about 100 nm, from about 1 nm to about 25 nm or from about 1 to about 10 nm. The particle size refers to the average diameter of the metal particles, as determined by TEM (transmission electron microscopy) or other suitable method. Generally, a plurality of particle sizes may exist in the metal nanoparticles obtained from the process described herein. In embodiments, the existence of different sized silver-containing nanoparticles is acceptable.

In embodiments, the composition is comprised of an organic-stabilized metal nanoparticle and a solvent. The organic stabilizer is associated with the surface of the metal nanoparticle.

In embodiments, the metal nanoparticles are composed of (i) one or more metals or (ii) one or more metal composites. Suitable metals may include, for example, Al, Ag, Au, Pt, Pd, Cu, Co, Cr, In, and Ni, particularly the transition metals, for example, Ag, Au, Pt, Pd, Cu, Cr, Ni, and mixtures thereof. Suitable metal composites may include Au—Ag, Ag—Cu, Ag—Ni, Au—Cu, Au—Ni, Au—Ag—Cu, and Au—Ag—Pd. The metal composites may also include non-metals, such as, for example, Si, C, and Ge. The various components of the metal composite may be present in an amount ranging, for example, from about 0.01% to about 99.9% by weight, particularly from about 10% to about 90% by weight. Furthermore, the composition described herein may not include any metal oxide nanoparticles.

In embodiments, the metal composite is a metal alloy composed of silver and one, two or more other metals, with silver comprising, for example, at least about 20% of the nanoparticles by weight, particularly greater than about 50% of the nanoparticles by weight.

If the metal nanoparticle is silver, the silver nanoparticles have a stability (that is, the time period where there is minimal precipitation or aggregation of the silver-containing nanoparticles in the composition) of, for example, at least from about 5 days to about 1 month, from about 1 week to about 6 months, from about 1 week to over 1 year. The stability can be monitored using a variety of methods, for example, a dynamic light scattering method that probes the particle size, a simple filtration method using a determined filter pore size, for example 1 micron, to evaluate the solid on the filter.

The weight percentage of the metal nanoparticles in the composition may be from, for example, about 5 weight percent to about 80 weight percent, from about 10 weight percent to about 60 weight percent or from about 15 weight percent to about 50 weight percent.

The composition described herein must contain a stabilizer that is associated with the surface of the metal nanoparticles and is not removed until the annealing of the metal nanoparticles during formation of metal features on a substrate. The stabilizer may be organic.

In embodiments, the stabilizer is physically or chemically associated with the surface of the metal nanoparticles. In this way, the nanoparticles have the stabilizer thereon outside of a liquid solution. That is, the nanoparticles with the stabilizer thereon may be isolated and recovered from a reaction mixture solution used in forming the nanoparticles and stabilizer complex. The stabilized nanoparticles may thus be subsequently readily and homogeneously dispersed in a solvent for forming a printable solution.

As used herein, the phrase "physically or chemically associated" between the metal nanoparticles and the stabilizer may be a chemical bond and/or other physical attachment. The chemical bond may take the form of, for example, covalent bonding, hydrogen bonding, coordination complex bonding, or ionic bonding, or a mixture of different chemical bonds. The physical attachment may take the form of, for example, van der Waals' forces or dipole-dipole interaction, or a mixture of different physical attachments.

The term "organic" in "organic stabilizer" refers to, for example, the presence of carbon atom(s), but the organic stabilizer may include one or more non-metal heteroatoms such as nitrogen, oxygen, sulfur, silicon, halogen, and the like. The organic stabilizer may be an organoamine stabilizer such as those described in U.S. Pat. No. 7,270,694, which is incorporated by reference herein in its entirety. Examples of the organoamine are an alkylamine, such as for example butylamine, pentylamine, hexylamine, heptylamine, octylamine, nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine, and the like, or mixtures thereof.

The metal nanoparticle is stabilized with a stabilizer which is comprised of a formula (I): X—Y. The X is a hydrocarbon group comprising at least 4 carbon atoms, including at least 8 carbon atoms, or at least 12 carbon atoms. The Y is a functional group attached to the surface of the metal nanoparticle. Examples of the functional groups Y include, for example, hydroxyl, amine, carboxylic acid, thiol and its derivatives, —OC(=S)SH (xanthic acid), pyridine, pyrrolidone, and the like. The organic stabilizer may be selected from the group consisting of polyethylene glycols, polyvinylpyridine, polyvinylpyrrolidone, and other organic surfactants. The organic stabilizer may be selected from the group consisting of a thiol such as, for example, butanethiol, pentanethiol, hexanethiol, heptanethiol, octanethiol, decanethiol, and dodecanethiol; a dithiol such as, for example, 1,2-ethanedithiol, 1,3-propanedithiol, and 1,4-butanedithiol; or a mixture of a thiol and a dithiol. The organic stabilizer may be selected from the group consisting of a xanthic acid such as, for example, o-methylxanthate, o-ethylxanthate, o-propylxanthic acid, o-butylxanthic acid, o-pentylxanthic acid, o-hexylxanthic acid, o-heptylxanthic acid, o-octylxanthic acid, o-nonylxanthic acid, o-decylxanthic acid, o-undecylxanthic acid, o-dodecylxanthic acid. Organic stabilizers containing a pyridine derivative (for example, dodecyl pyridine) and/or organophosphine that can stabilize metal nanoparticles may also be used as the stabilizer herein.

Further examples of organic stabilized metal nanoparticles may include: the carboxylic acid-organoamine complex stabilized metal nanoparticles, described in U.S. Patent Application Pub. No. 2009/0148600; the carboxylic acid stabilizer metal nanoparticles described in U.S. Patent App. Pub. No. 2007/0099357 A1, and the thermally removable stabilizer and the UV decomposable stabilizers described in U.S. Patent Application Pub. No. 2009/0181183, each of which is incorporated by reference herein in their entirety.

The extent of the coverage of stabilizer on the surface of the metal nanoparticles may vary, for example, from partial to full coverage depending on the capability of the stabilizer to stabilize the metal nanoparticles. Of course, there is variability as well in the extent of coverage of the stabilizer among the individual metal nanoparticles.

The weight percentage of the organic stabilizer in the metal nanoparticle (including only the metal particle and the stabilizer, exclude the solvent) may be from, for example, about 3 weight percent to about 80 weight percent, from about 5 weight percent to about 60 weight percent, from about 10 weight percent to about 50 weight percent, or from about 10 weight percent to about 30 weight percent.

In embodiments, the metal nanoparticle is an organoamine stabilized silver nanoparticle. The weight percentage of silver in the silver nanoparticle (silver and stabilizer only) is from about 80% to about 95%, including from about 85% to about 90%. The weight percentage of the silver nanoparticle in the silver nanoparticle composition (including the solvent) is from about 20% to about 70% by weight, including from about 30% to about 60% by weight A solvent can be characterized by its Hansen solubility parameters, which are the dispersion parameter, the solubility parameter, and the hydrogen bonding parameter. The solvent herein should have a dispersion parameter of about 16 $MPa^{0.5}$ or more, and the sum of a polarity parameter and a hydrogen bonding parameter is about 8.0 $MPa^{0.5}$ or less. More in particular, a selected solvent has a dispersion parameter value of about 16 $MPa^{0.5}$ or more, for example from about 16 $MPa^{0.5}$ to about 25 $MPa^{0.5}$, or about 18 $MPa^{0.5}$ or more, for example from about 18 $MPa^{0.5}$ to about 25 $MPa^{0.5}$; and a sum of the polarity parameter and the hydrogen bonding parameter is about 8.0 $MPa^{0.5}$ or less, including 5.5 $MPa^{0.5}$ or less. Desirably, the polarity parameter is from about 1.5 $MPa^{0.5}$ to about 0 $MPa^{0.5}$, including from about 1.0 $MPa^{0.5}$ to about 0 $MPa^{0.5}$, and the hydrogen bonding parameter is from about 1.5 $MPa^{0.5}$ to about 0 $MPa^{0.5}$, including from about 1.0 $MPa^{0.5}$ to about 0 $MPa^{0.5}$.

The selection of the solvent is based on the parameter values. A solvent, which is within the described Hansen solubility parameters, may be mixed with another solvent, so as the at least one solvent is within the indicated Hansen solubility parameter ranges.

Each of the Hansen solubility parameters for a given solvent can be found in known references, such as, *Hansen Solubility Parameters: A User's Handbook*, by Charles Hansen, 2007, 2nd Edition. Also, known modeling software, for example Fedors Cohesive Energy Density using a software such as SP2 method, can be used to calculate the Hansen solubility parameters based on the chemical structure of the solvent. The calculation is performed with the temperature of the solvent at 25° C.

In the Hansen solubility parameters, hydrogen bonding is an attractive interaction of a hydrogen atom with an electronegative atom. Therefore, a solvent will tend not to detach an organoamine stabilizer from the surface of the nanoparticle when the solvent has a hydrogen bonding parameter of about 1.5 $MPa^{0.5}$ or lower.

Polarity is an attraction caused by differences in electrical charges. Therefore, a solvent will tend not to detach an organoamine stabilizer from the surface of the nanoparticle when the solvent has a Hansen solubility polarity parameter of about 1.5 $MPa^{0.5}$ or lower.

Dispersion is an attractive force between atoms, molecules and surfaces. To ensure good stability of the metal nanoparticle stabilized by an organoamine, the solvent should have a dispersion parameter of at least 16 $MPa^{0.5}$.

Furthermore, the solvent may have a vapor pressure, for example, from about less than about 20 mmHg at about 20° C., from about 10 mmHg at about 20° C. or preferably less than 5 mmHg at 20° C.

Based on the previous discussion regarding the Hansen solubility parameters, examples of potential solvents suitable herein include, for example, tetradecane, hexadecane, methyl naphthalene, tetrahydronapthalene, tetramethyl benzene, toluene, xylene, ethylbenzene, trimethylbenzene, decahydronaphthalene, cis-decahydronaphthalene, trans-decahydronaphthalene and mixtures thereof.

Table Of Hansen Solubility Parameters

| Solvent | Dispersion parameter ($MPa^{0.5}$) | Polarity parameter ($MPa^{0.5}$) | Hydrogen bonding parameter ($MPa^{0.5}$) |
|---|---|---|---|
| decahydronaphthalene | 18.0 | 0 | 0 |
| cis-decahydronaphthalene | 18.8 | 0 | 0 |
| hexadecane | 16.3 | 0 | 0 |
| 1-methyl naphthalene | 20.6 | 0.8 | 4.7 |
| tetrahydronaphthalene | 19.6 | 2.0 | 2.9 |
| 1,2,3,5-tetramethyl benzene | 18.6 | 0.5 | 0.5 |
| toluene | 18.0 | 1.4 | 2.0 |
| o-xylene | 17.8 | 1.0 | 3.1 |
| 1,2,4-trimethylbenzene | 18.0 | 1.0 | 1.0 |
| ethyl benzene | 17.8 | 0.6 | 1.4 |

In embodiments, the solvent is decahydronaphthalene. In other embodiments, the solvent is a mixture of cis and trans-decahydronaphthalene. In still other embodiments, the solvent is cis-decahydronaphthalene.

The composition may have a surface tension from about 25 to about 35 mN/m, including from about 28 to about 32 mN/m. The composition may also have a viscosity from about 3 cps to about 20 cps, including from about 5 cps to about 15 cps.

Use of the indicated solvents can improve the metal nanoparticle composition compared to other metal nanoparticle compositions that do not utilize a solvent within the disclosed Hansen solubility parameters. The composition itself has been improved in its shelf life or stability and also its dispersibility of the metal nanoparticles in the composition. Also, the metal nanoparticle composition exhibits improved printed feature morphology such that the coffee ring effect, black dots and line width have all been improved, most substantially when the solvent is decahydronaphthalene.

Figure 1:
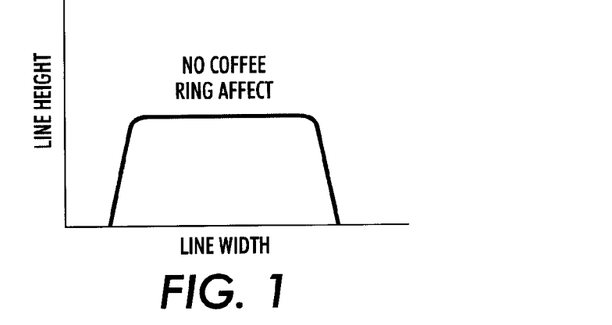
FIG. 1 illustrates a representative parameter of the coffee ring effect; the parameter is determined by comparing the measured height of the edge to the measured height of the center ($h_{edge}/h_{center}$) A ratio of 1.0 results in the height of the edge equal to the height of the center, and there is no coffee ring effect.
Figure 2:
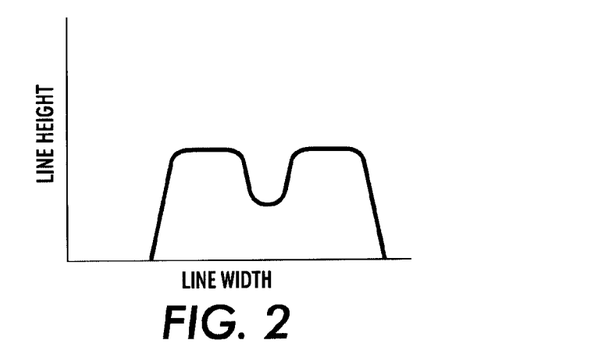
FIG. 2 is a graph showing the $h_{edge}$ and $h_{center}$ when the coffee ring effect ratio is greater than 1.0, and therefore the center is thinner compared to the edge.
Figure 3:
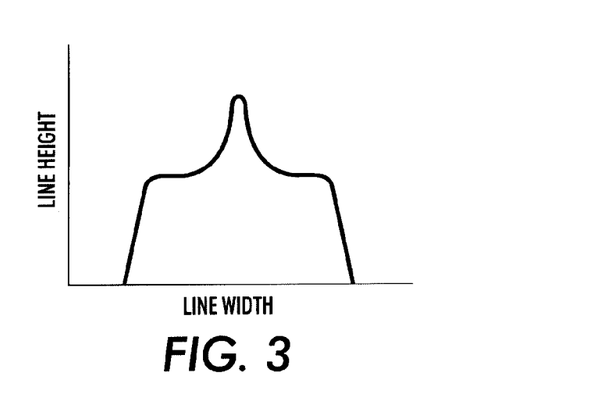
FIG. 3 is a graph showing the $h_{edge}$ and $h_{center}$ when the coffee ring effect ratio is less than 1, and therefore the center is thicker compared to the edge.

To quantify the coffee ring effect of a composition, a parameter $h_{edge}/h_{center}$ (also referred to as $h_e/h_c$ and defined here as the ratio of the edge height to the center height) is used. The disclosed metal nanoparticle composition and the comparable composition were both printed onto a substrate using a DMP-2800 inkjet printed equipped with 10 pL cartridges. The line profile was characterized after printing using a surface profilometer. The height of the edge ($h_{edge}$) and the height of the center ($h_{center}$) can be obtained. The ratio of $h_{edge}/h_{center}$ will illustrate if there is a coffee ring effect. (See FIG. 1). As seen in FIG. 1, when $h_{edge}/h_{center}$ is 1.0, there is no coffee ring effect and the surface of the printed line would be perfectly flat. As seen in FIG. 2, when $h_{edge}/h_{center}$ is greater than 1.0, the height of the center is less than the height of the edge, indicating a coffee ring effect, which becomes more apparent as the ratio increases from 1.0. Finally, as seen in FIG. 3, when $h_{edge}/h_{center}$ is lower than 1.0, the height of the center is higher than the height of the edge. This may be acceptable for most applications as well. In embodiments, the features printed with the metal nanoparticle composition of this disclosure have a $h_{edge}/h_{center}$ of around 1.0, for example from about 0.8 to about 1.2. In other embodiments, the $h_{edge}/h_{center}$ is less than 1.5 to about 1.0.

Figure 4:
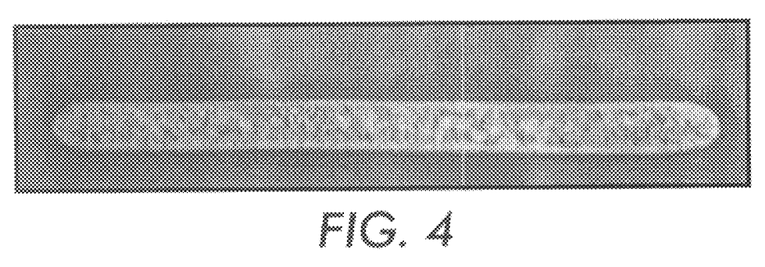
FIG. 4 is a photograph of a printed line of Comparative Composition 1 prepared with silver nanoparticles of batch 1.
Figure 5:
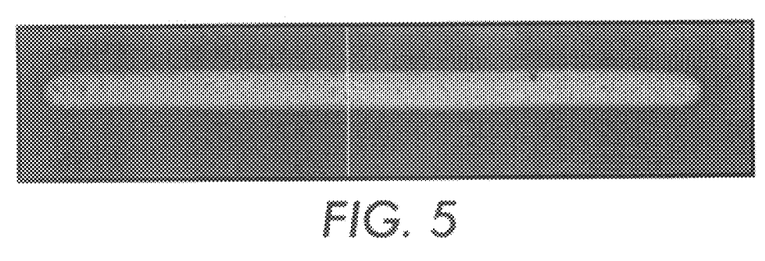
FIG. 5 is a photograph of a printed line of Comparative Composition 2 prepared with silver nanoparticles of batch 2.
Figure 6:
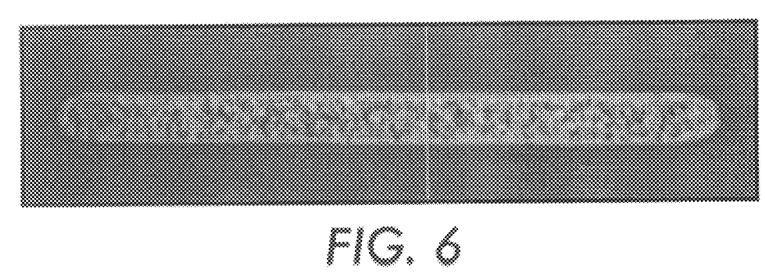
FIG. 6 is a photograph of a printed line of Comparative Composition 3 prepared with silver nanoparticles of batch 3.
Figure 7:
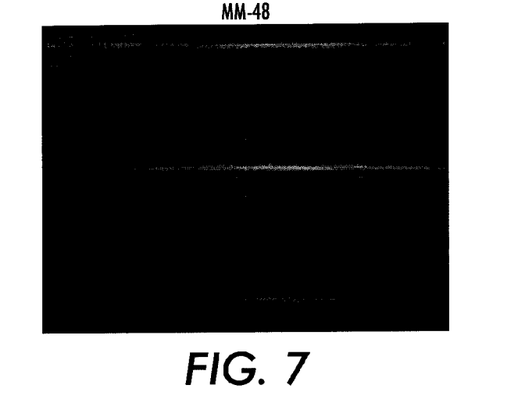
FIG. 7 is a photograph of a printed line of Example 1 prepared with silver nanoparticles of batch 1.
Figure 8:
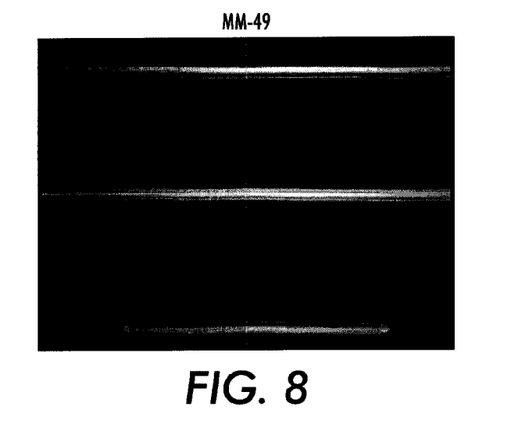
FIG. 8 is a photograph of a printed line of Example 2 prepared with silver nanoparticles of batch 2.
Figure 9:
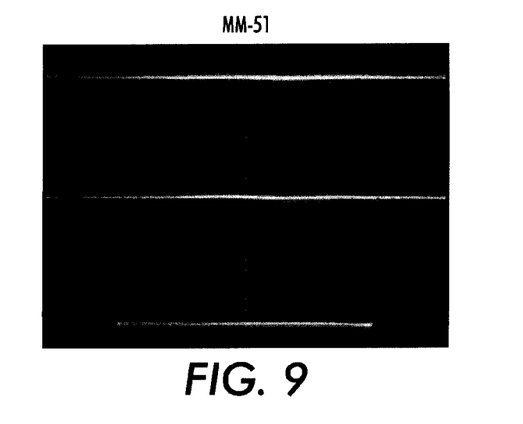
FIG. 9 is a photograph of a printed line of Example 3 prepared with silver nanoparticles of batch 3.

To quantify the black dots, a measurement of the surface roughness of a feature that was formed by the composition on the substrate after the printing was taken. It should be noted that the roughness of the substrate is minimal. The same printing method as above was performed. The measurement was made by measuring the surface roughness of the printed line of the compositions, for example Ra. The surface roughness can be measured by many methods, for example, by using a surface profilometer. The more numerous and larger the black dots, the more rough the surface is. The composition with a solvent that fits the Hansen solubility parameters had a surface roughness (Ra) of less than 15 nm, and was about 1 nm to 10 nm. Therefore, the composition had a very smooth appearance after printing. The comparable composition was found to have a surface roughness (Ra) of 15 nm or more, and could be up to 30 nm to 60 nm. If the surface roughness is high, the printed line will have multiple black dots present, thus the more black dots present, the more rough the printed composition is. Examples of printings with black dots present and not present can be seen in FIG. 4.

Furthermore, the electrically conductive line formed by printing the metal nanoparticle composition in single drop manner may have a width less than about 200 microns, such as, for example, from about 10 microns to about 200 microns, from about 25 microns to about 150 microns, from about 50 microns to about 100 microns and from about 75 microns to about 100 microns. The comparative compositions were found to have a line width of at least 165 microns while the metal nanoparticle composition disclosed herein had a line width of no more than 90 microns. Comparison of the line width numbers are based on the same printing conditions such as the same printhead, for example Dimatix DMP-2800 inkjet printer equipped with 10 pL cartridges. Given the same nozzle size and the same jetting volume, the disclosed composition has a reduction of the line width by at least about 50%, including a factor of 2.

The composition has an improved shelf-life or stability over comparative composition. The shelf-life can be monitor using parameters such as viscosity of the composition, agglomeration of the composition. The disclosed composition exhibited a stable viscosity over time while the comparative composition showed a dramatic change in viscosity over time.

The fabrication of conductive features, such as an electrically conductive element, from the metal nanoparticle composition can be carried out by depositing the composition on a substrate using any suitable liquid deposition technique at any suitable time prior to or subsequent to the formation of other optional layer or layers on the substrate. Thus, liquid deposition of the composition on the substrate can occur either on a substrate or on a substrate already containing layered material, for example, a semiconductor layer and/or an insulating layer.

The phrase "liquid deposition technique" refers to, for example, deposition of a composition using a liquid process such as printing or liquid coating, where the liquid is a homogeneous or heterogeneous dispersion of the metal nanoparticles in the solvent. The metal nanoparticle composition may be referred to as an ink when it is used in an inkjet printer or similar printing device to be deposited on a substrate. Examples of liquid coating processes may include, for example, spin coating, blade coating, rod coating, dip coating, and the like. Examples of printing techniques may include, for example, lithography or offset printing, gravure, flexography, screen printing, stencil printing, inkjet printing, stamping (such as microcontact printing), and the like. Liquid deposition deposits a layer or line of the composition having a thickness ranging from about 5 nanometers to about 5 millimeters, such as from about 10 nanometers to about 1000 micrometers on the substrate. The deposited metal nanoparticle composition at this stage may or may not exhibit appreciable electrical conductivity.

The metal nanoparticles can be spin-coated from the metal nanoparticles dispersion, for example, for about 10 seconds to about 1000 seconds, for about 50 seconds to about 500 seconds or from about 100 seconds to about 150 seconds, onto a substrate at a speed, for example, from about 100 revolutions per minute ("rpm") to about 5000 rpm, from about 500 rpm to about 3000 rpm and from about 500 rpm to about 2000 rpm.

The substrate upon which the metal features are deposited may be any suitable substrate, including, for example, silicon, glass plate, plastic film, sheet, fabric, or paper. For structurally flexible devices, plastic substrates, such as for example polyester, polycarbonate, polyimide sheets and the like may be used. The thickness of the substrate may be from amount 10 micrometers to over 10 millimeters with an exemplary thickness being from about 50 micrometers to about 2 millimeters, especially for a flexible plastic substrate and from about 0.4 to about 10 millimeters for a rigid substrate such as glass or silicon.

Heating the deposited composition at a temperature of, for example, at or below about 200° C., such as, for example, from about 70° C. to about 200° C., from about 70° C. to about 180° C. and from about 70° C. to about 160° C., induces the metal nanoparticles to "anneal" and thus forms an electrically conductive layer, which is suitable for use as an electrically conductive element in electronic devices. The heating temperature is one that does not cause adverse changes in the properties of previously deposited layer(s) or the substrate (whether single layer substrate or multilayer substrate). Also, the low heating temperatures described above allow the use of low cost plastic substrates, which have an annealing temperature below 200° C.

The heating can be performed for a time ranging from, for example, 0.01 second to about 10 hours and from about 10 seconds to 1 hour. The heating can be performed in air, in an inert atmosphere, for example, under nitrogen or argon, or in a reducing atmosphere, for example, under nitrogen containing from 1 to about 20 percent by volume hydrogen. The heating can also be performed under normal atmospheric pressure or at a reduced pressure of, for example, from about 1000 mbars to about 0.01 mbars.

As used herein, the term "heating" encompasses any technique(s) that can impart sufficient energy to the heated material or substrate to (1) anneal the metal nanoparticles and/or (2) remove the optional stabilizer from the metal nanoparticles. Examples of heating techniques may include thermal heating (for example, a hot plate, an oven, and a burner), infra-red ("IR") radiation, a laser beam, flash light, microwave radiation, or UV radiation, or a combination thereof.

Heating produces a number of effects. Prior to heating, the layer of the deposited metal nanoparticles may be electrically insulating or with very low electrical conductivity, but heating results in an electrically conductive layer composed of annealed metal nanoparticles, which increases the conductivity. In embodiments, the annealed metal nanoparticles may be coalesced or partially coalesced metal nanoparticles. In embodiments, it may be possible that in the annealed metal nanoparticles, the metal nanoparticles achieve sufficient particle-to-particle contact to form the electrically conductive layer without coalescence.

In embodiments, after heating, the resulting electrically conductive line that has a thickness ranging, for example, from about 5 nanometers to about 5 microns, from about 10 nanometers to about 2 microns, from about 50 nanometers to about 300 nanometers microns, from about 50 nanometers to about 200 nanometers and from about 50 nanometers to about 150 nanometers.

The conductivity of the resulting metal element produced by heating the deposited metal nanoparticle composition is, for example, more than about 100 Siemens/centimeter ("S/cm"), more than about 1000 S/cm, more than about 2,000 S/cm, more than about 5,000 S/cm, or more than about 10,000 S/cm or more than 50,000 S/cm.

The resulting elements can be used as electrodes, conductive pads, interconnect, conductive lines, conductive tracks, and the like in electronic devices such as thin film transistors, organic light emitting diodes, RFID (radio frequency identification) tags, photovoltaic, displays, printed antenna and other electronic devices which require conductive elements or components.

In yet other embodiments, there is provided a thin film transistor comprising:
(a) an insulating layer;
(b) a gate electrode;
(c) a semiconductor layer;
(d) a source electrode; and
(e) a drain electrode,
wherein the insulating layer, the gate electrode, the semiconductor layer, the source electrode, and the drain electrode are in any sequence as long as the gate electrode and the semiconductor layer both contact the insulating layer, and the source electrode and the drain electrode both contact the semiconductor layer, and
wherein at least one of the source electrode, the drain electrode, and the gate electrode are formed by: providing a solution containing metal nanoparticles stabilized by an organoamine compound, depositing the organoamine-stabilized composition onto the substrate, and heating the organoamine-stabilized composition on the substrate to a temperature from about 70° C. to about 200° C. to form conductive features on the substrate.

A gate electrode, a source electrode, and a drain electrode may thus be fabricated by embodiments herein. The thickness of the gate electrode layer ranges for example from about 10 nm to about 2000 nm. Typical thicknesses of source and drain electrodes are, for example, from about 40 nm to about 1 micrometer with the more specific thickness being about 60 nm to about 400 nm.

The insulating layer generally may be an inorganic material film or an organic polymer film. Examples of inorganic materials suitable as the insulating layer may include, for example, silicon oxide, silicon nitride, aluminum oxide, barium titanate, barium zirconium titanate and the like. Illustrative examples of organic polymers for the insulating layer may include, for example, polyesters, polycarbonates, poly(vinyl phenol), polyimides, polystyrene, poly(methacrylate)s, poly(acrylate)s, epoxy resin and the like. The thickness of the insulating layer is, for example from about 10 nm to about 500 nm depending on the dielectric constant of the dielectric material used. An exemplary thickness of the insulating layer is from about 100 nm to about 500 nm. The insulating layer may have a conductivity that is, for example, less than about $10^{-12}$ S/cm.

Situated, for example, between and in contact with the insulating layer and the source/drain electrodes is the semiconductor layer wherein the thickness of the semiconductor layer is generally, for example, about 10 nm to about 1 micrometer, or about 40 to about 100 nm. Any semiconductor material may be used to form this layer. Exemplary semiconductor materials include regioregular polythiophene, oligothiophene, pentacene, and the semiconductor polymers disclosed in U.S. Publication No. 2003/0160230 A1; U.S. Publication No. 2003/0160234 A1; U.S. Publication No. 2003/0136958 A1; the disclosures of which are totally incorporated herein by reference. Any suitable technique may be used to form the semiconductor layer. One such method is to apply a vacuum of about $10^{-5}$ torr to $10^{-7}$ torr to a chamber containing a substrate and a source vessel that holds the compound in powdered form, and heat the vessel until the compound sublimes onto the substrate. The semiconductor layer can also generally be fabricated by solution processes such as spin coating, casting, screen printing, stamping, or jet printing of a solution or dispersion of the semiconductor.

The insulating layer, the gate electrode, the semiconductor layer, the source electrode, and the drain electrode are formed in any sequence, particularly where in embodiments the gate electrode and the semiconductor layer both contact the insulating layer, and the source electrode and the drain electrode both contact the semiconductor layer. The phrase "in any sequence" includes sequential and simultaneous formation. For example, the source electrode and the drain electrode can be formed simultaneously or sequentially. The composition, fabrication, and operation of thin film transistors are described in U.S. Pat. No. 6,107,117, the disclosure of which is totally incorporated herein by reference.

In embodiments, at least one of the gate, source or drain electrode in a thin-film transistor is formed by using a method described herein to form conductive features on a substrate, providing a composition containing metal nanoparticles stabilized by an organoamine compound; depositing the organoamine-stabilized metal nanoparticle onto the substrate, wherein during the deposition or following the deposition of the organoamine-stabilized metal nanoparticle onto the substrate, and removing the stabilizer, at a temperature below about 200° C., to form conductive features on the substrate.

Embodiments herein are further illustrated by way of the following examples. All percentages and parts are by weight unless otherwise indicated. Room temperature refers to a temperature ranging for example from about 20° C. to about 25° C.

EXAMPLES

Preparation of the Silver Nanoparticles

The composition was produced with silver nanoparticles produced in three separate batches using a method already disclosed in U.S. patent application Ser. No. 12/369,861. The three batches of silver nanoparticles, batch 1, batch 2 and batch 3, were then used in the preparation of Comparative Examples 1-3 and Examples 1-3, respectively. Three batches of silver nanoparticle powders were synthesized in the same manner to evaluate the reproducibility. All three batches of silver nanoparticles contained silver around 85 weight percent.

Preparation of Comparative Examples 1, 2 and 3

The composition was prepared by mixing silver nanoparticle powders with a solvent mixture of ISOPAR G and terpineol at a 2:1 ratio. The silver nanoparticles are 50 weight percent of the silver formulation. After the silver nanoparticles were mixed into the solvents, the composition was filtered using a 1 μm syringe filter. The composition was printed using a DMP-2800 inkjet printer equipped with 10 pL cartridges. After printing and thermal annealing, the line profile was characterized using a surface profilometer.

Preparation of Example 1, 2 and 3

The composition was prepared by mixing silver nanoparticle powders produced from the same batches as the comparative examples. However, the preparation of the composition differed as discussed below. The solvent used was decahydronaphthalene. Decahydronaphthalene has the following Hansen solubility parameters: dispersion parameter of 18.0 MPa$^{0.5}$, polarity parameter of 0.0 MPa$^{0.5}$ and hydrogen bonding parameter of 0.0 MPa$^{0.5}$, as can be found in *Hansen Solubility Parameters: A User's Handbook* reference. The silver nanoparticle was at 40 weight percent load. After the silver nanoparticles were mixed into the solvents, the composition was filtered using a 1 µm syringe filter. The composition was printed using a DMP-2800 inkjet printer equipped with 10 pL cartridges. After printing and thermal annealing, the line profile was characterized using surface profilometer.

RESULTS

| Sample | Width (um) | Surface roughness, Ra (nm) | Coffee ring effect ($h_{edge}/h_{centre}$) at substrate temperature of 30° C. |
|---|---|---|---|
| Comparative Example 1 | 190 | ~50 | 2.0 |
| Comparative Example 2 | 165 | ~45 | 2.3 |
| Comparative Example 3 | 220 | ~38 | 2.5 |
| Example 1 | <90 | ~10 | 1.1 |
| Example 2 | <90 | ~8 | 1.2 |
| Example 3 | <90 | ~12 | 1.0 |

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A composition comprising a silver nanoparticle having a stabilizer associated with a surface of the silver nanoparticle, the stabilizer consisting of an organoamine stabilizer, and a solvent,
   wherein the organoamine stabilizer is a primary alkylamine having at least 9 carbon atoms,
   wherein the solvent is one or more of decahydronaphthalene, cis-decahydronaphthalene and trans-decahydronaphthalene, and
   wherein a silver content in the silver nanoparticle is from about 80 wt. % to about 95 wt. % based on the total weight of the silver nanoparticle and the organoamine stabilizer.

2. The composition of claim 1, wherein a resulting printing of the composition of claim 1 has an edge height to a center height ratio of about 1.2 to about 0.8.

3. The composition of claim 1, wherein a resulting printing of the composition of claim 1 has a surface roughness of about 15 nm to about 0 nm.

4. The composition of claim 1, wherein the silver nanoparticle is selected from the group consisting of silver, silver-copper composite, silver-gold-copper composite, silver-gold-palladium composite and combinations thereof.

5. The composition of claim 1, wherein the organoamine stabilizer is selected from the group consisting of nonylamine, decylamine, hexadecylamine, undecylamine, dodecylamine, tridecylamine, tetradecylamine, and combinations thereof.

6. The composition of claim 1, wherein the composition further comprises a co-solvent,
   wherein the solvent and the co-solvent each has the following Hansen solubility parameters: a dispersion parameter of about 16 MPa$^{0.5}$ or more, and a sum of a polarity parameter and a hydrogen bonding parameter of about 8.0 MPa$^{0.5}$ or less, and
   wherein the co-solvent is selected from the group consisting of tetradecane, hexadecane, methyl naphthalene, tetrahydronaphthalene, tetramethyl benzene, toluene, xylene, ethylbenzene and trimethylbenzene.

7. The composition of claim 6, wherein a resulting printing of the composition has an edge height to center height ratio of about 1.2 to about 0.8 and a surface roughness of about 15 nm or less.

8. The composition of claim 6, wherein the silver nanoparticle is selected from the group consisting of silver, silver-copper composite, silver-gold-copper composite, silver-gold-palladium composite and combinations thereof.

9. The composition of claim 6, wherein the organoamine stabilizer is selected from the group consisting of nonylamine, decylamine, hexadecylamine, undecylamine, dodecylamine, tridecylamine, tetradecylamine, and combinations thereof.

10. The composition of claim 6, wherein the solvent and the co-solvent each has the following Hansen solubility parameters: the dispersion parameter of about 18 MPa$^{0.5}$ or more, and the sum of the polarity parameter and the hydrogen bonding parameter of about 5.5 MPa$^{0.5}$ or less.

11. The composition of claim 1 consisting essentially of the silver nanoparticle, the organoamine stabilizer associated with the surface of the silver nanoparticle, and the solvent.

12. A method of forming conductive features on a substrate, the method comprising:
    providing a liquid composition comprising a silver nanoparticle having a stabilizer associated with a surface of the silver nanoparticle, the stabilizer consisting of an organoamine stabilizer, and a solvent, wherein the organoamine stabilizer is a primary alkylamine having at least 9 carbon atoms, wherein the solvent is one or more of decahydronaphthalene, cis-decahydronaphthalene and trans-decahydronaphthalene, and wherein a silver content in the silver nanoparticle is from about 80 wt. % to about 95 wt. % based on the total weight of the silver nanoparticle and the organoamine stabilizer,
    depositing the liquid composition onto the substrate to form deposited features, and
    heating the deposited features on the substrate to a temperature from about 70° C. to about 200° C. to form conductive features on the substrate.

13. The method of claim 12, wherein the conductive features on the substrate have an edge height to center height ratio from about 1.2 to 0.8, a surface roughness about 15 nm or less and a conductivity about $1.0 \times 10^4$ S/cm or more.

14. The method of claim 12, wherein the solvent is cis-decahydronaphthalene, and the metal nanoparticle is silver nanoparticle.

15. The method of claim 12, wherein the organoamine stabilizer is selected from the group consisting of nonylamine, decylamine, hexadecylamine, undecylamine, dodecylamine, tridecylamine, tetradecylamine, diaminopentane, diaminohexane, diaminoheptane, diaminooctane, diaminononane, diaminodecane, diaminooctane, dipropylamine, dibutylamine, dipentylamine, dihexylamine, diheptylamine, dioctylamine, dinonylamine, didecylamine, methylpropylamine, ethylpropylamine, propylbutylamine, ethylbutylamine, ethylpentylamine, propylpentylamine, butylpentylamine, tributylamine, trihexylamine and combinations thereof.

16. A composition comprising a silver nanoparticle having a stabilizer associated with a surface of the silver nanoparticle, the stabilizer consisting of an organoamine stabilizer, and a solvent,
    the organoamine stabilizer is hexadecylamine,
    wherein the solvent is one or more of decahydronaphthalene, cis-decahydronaphthalene and trans-decahydronaphthalene, and
    wherein a silver content in the silver nanoparticle is from about 80 wt. % to about 95 wt. % based on the total weight of the silver nanoparticle and the organoamine stabilizer.

\* \* \* \* \*